United States Patent
Wong et al.

(10) Patent No.: US 6,850,196 B2
(45) Date of Patent: Feb. 1, 2005

(54) INTEGRATED INVERTED F ANTENNA AND SHIELD CAN

(75) Inventors: Argus C. W. Wong, Hong Kong (CN); Wai Hung Leung, Hong Kong (CN)

(73) Assignee: VTech Telecommunications, Limited, Hong Kong (CN)

( * ) Notice: Subject to any disclaimer, the term of this patent is extended or adjusted under 35 U.S.C. 154(b) by 0 days.

(21) Appl. No.: 10/336,686

(22) Filed: Jan. 6, 2003

(65) Prior Publication Data

US 2004/0160369 A1 Aug. 19, 2004

(51) Int. Cl.⁷ .................................................. H01Q 1/24
(52) U.S. Cl. ...................... 343/702; 343/841; 343/846
(58) Field of Search ............................. 343/702, 841, 343/846, 848, 700 MS

(56) References Cited

U.S. PATENT DOCUMENTS

| | | | |
|---|---|---|---|
| 5,365,246 A | 11/1994 | Rasinger et al. | 343/702 |
| 6,218,991 B1 | 4/2001 | Sanad | 343/700 MS |
| 6,255,994 B1 | 7/2001 | Saito | 343/700 MS |
| 6,593,888 B2 * | 7/2003 | Fu | 343/700 MS |
| 2003/0103014 A1 * | 6/2003 | Birnbaum et al. | 343/841 |

FOREIGN PATENT DOCUMENTS

| | | |
|---|---|---|
| JP | 2003 298 340 | 10/2003 |
| WO | WO 99/27607 | 6/1999 |
| WO | WO 03/049229 | 6/2003 |

OTHER PUBLICATIONS

"A New Enhanced–Bandwidth Internal Antenna for Portable Communication Systems", Rasinger et al. 40$^{th}$ IEEE Vehicular Technology Conference, May 1990.

* cited by examiner

*Primary Examiner*—Hoang V. Nguyen
(74) *Attorney, Agent, or Firm*—Shaw Pittman LLP

(57) ABSTRACT

An inverted F antenna with integrated shield is constructed from an electrically conducting sheet that is folded into a shape that provides both a shield can covers an RF module of circuit and an inverted F antenna such that shield can functions also as a ground plane for the antenna. In a pre-folded state the sheet has a shield can portion and a radiating element portion that are connected to each other by a ground feed line that bridges the shield can portion and radiating element portion. The shield can portion preferably includes a plurality of walls that are foldable along respective folds. The radiating element portion preferably includes a plurality of edges and a signal feed line extending from a first one of the plurality of edges. The ground feed line extends from a second one of said plurality of edges. When the sheet is folded, the radiating element portion is suspended over the shield can portion and is substantially fixed with respect to the shield can portion by the ground feed line and the signal feed line.

23 Claims, 5 Drawing Sheets

INTEGRATED INVERTED F ANTENNA AND SHIELD CAN

BACKGROUND

1. Field of the Invention

The present invention relates generally to radio frequency (RF) devices, and more particularly to inverted F antennas, shield cans and related circuitry and devices.

2. Background of the Invention

Planar inverted F antennas generally include at least one planar radiating element and a ground plane in a plane parallel to the radiating element. A short ground tab typically joins the radiating element to the ground plane. In one known configuration, as exemplified by the structure shown in U.S. Pat. No. 6,218,991 to Sanad, the radiating element is fed via a separate center pin that is located within a periphery of the ground plane. In this design, the short ground tab is also located within the periphery of the ground plane. Also, in Sanad's device, the radiating element, ground plane, center pin and short ground tab are all separate components that must be assembled together.

In another known configuration, like that shown in FIG. 1 of U.S. Pat. No. 6,255,994 to Saito, both a feeding terminal and a grounding terminal are located at one end of the radiating element, are both integral with the radiating element, and are both soldered to a portion of the ground plane. The device shown by Saito also includes a spacer that is disposed between the radiating element and the ground plane. Thus, as exemplified by both the Sanad and Saito devices, inverted F antennas typically comprise several individual parts that must be assembled and soldered together to obtain the desired configuration.

Inverted F antennas, like those mentioned above, are typically used in combination with radio frequency (RF) modules (e.g., transmitter, receivers) that are combined in relatively small packages that enclose, for example, mobile or cordless telephones. Such RF modules are typically encapsulated or substantially surrounded by a shield or shielding can that enables the RF module to operate without interference caused by a local antenna or other close or distant radiation source. A typical shield can 90 mounted to a circuit board is shown in FIG. 9.

Thus, in many devices that employ an inverted F antenna, not only is a ground plane for the inverted F antenna necessary, but there must also be provided a separate shield can for an associated RF module. Designing devices that incorporate both of these elements (ground plane and shield can), however, undesirably increases space requirements for the overall device and package.

BRIEF SUMMARY OF THE INVENTION

To address the foregoing and other deficiencies in the prior art, the present invention provides an inverted F antenna with an integrated shield can. In a preferred embodiment, the present invention comprises a unitary sheet of electrically conductive material, such as steel, that is cut or stamped into a predetermined shape such that when the cut or stamped sheet is folded, both a shield can (that is properly sized to cover an RF module) and an inverted F antenna (that is appropriately sized for a desired frequency response) are provided, with the shield can functioning as the ground plane for the inverted F antenna. This inventive configuration has several advantages, including compact size for both an internal-use antenna and shielding ability, simplified assembly, and excellent electrical performance.

More specifically, because a shield can is often the best reference ground in an electrical design, the use of the shield can as the ground plane for the inverted F antenna in accordance with the present invention can significantly improve the electrical properties of the antenna. Thus, not only is space saved with the present invention, but the electrical performance of the internal inverted F antenna is also improved.

Further, because the shield can and antenna are constructed from a single sheet of material, assembly of both components is significantly simplified. As a result, the cost of the antenna and shield can is substantially reduced.

Finally, since an internal antenna can now more easily and inexpensively be employed (instead of a conventional telescoping or extended antenna), devices such cordless telephones become more robust and better able to withstand the typical bumps and drops that a consumer product such as a cordless telephone often experiences.

The foregoing and other advantages of the present invention will become even more apparent to those skilled in the art upon a reading the following detailed description in conjunction with the associated drawings.

DETAILED DESCRIPTION OF THE INVENTION

A significant aspect of the present invention is the ability to integrate the functions of both an antenna and shield can. More particularly, the present invention provides a unique configuration by which the functionality of a planar portion of a shield can and an inverted F-antenna ground plane are shared, resulting in a more compact design and excellent electrical performance.

Figure 1:
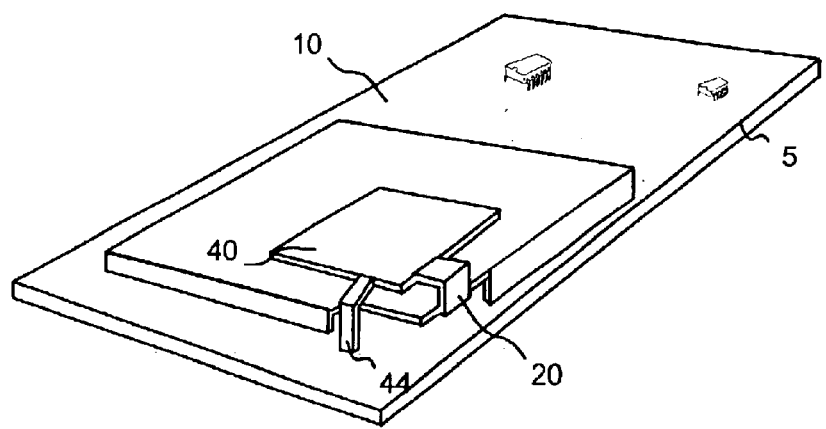
FIG. 1 is a perspective view of an integrated inverted F antenna and shield can mounted on a circuit board in accordance with the present invention.
Figure 2:
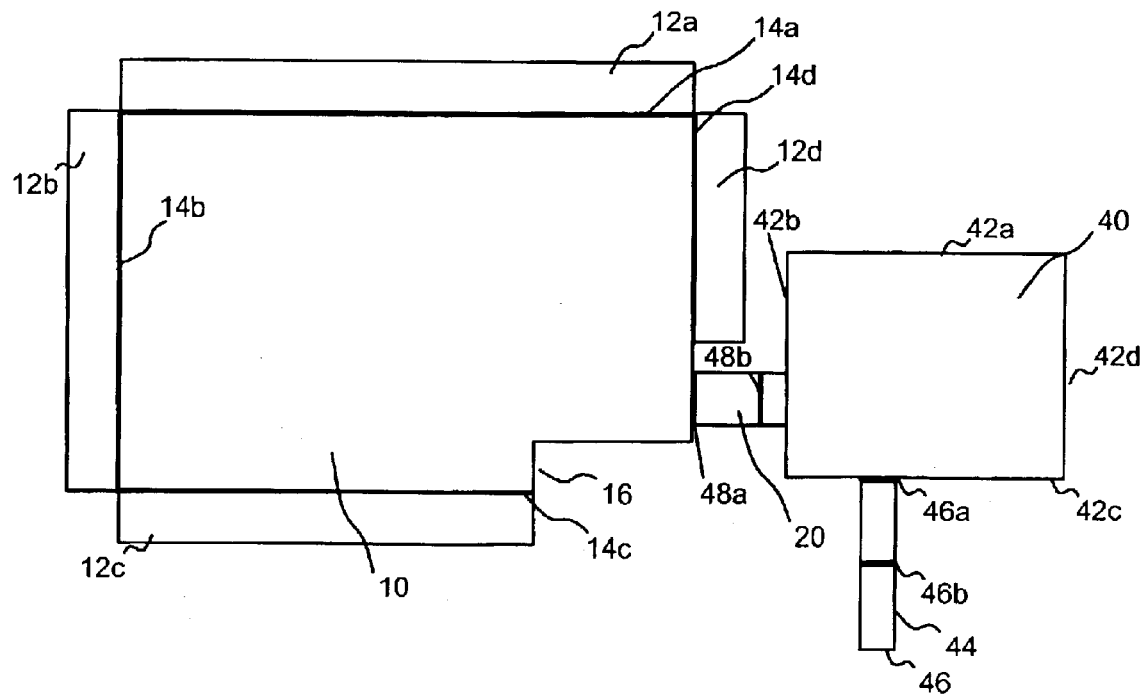
FIG. 2 is a plan view of a single sheet of material before folding in accordance with the present invention.
Figure 3:
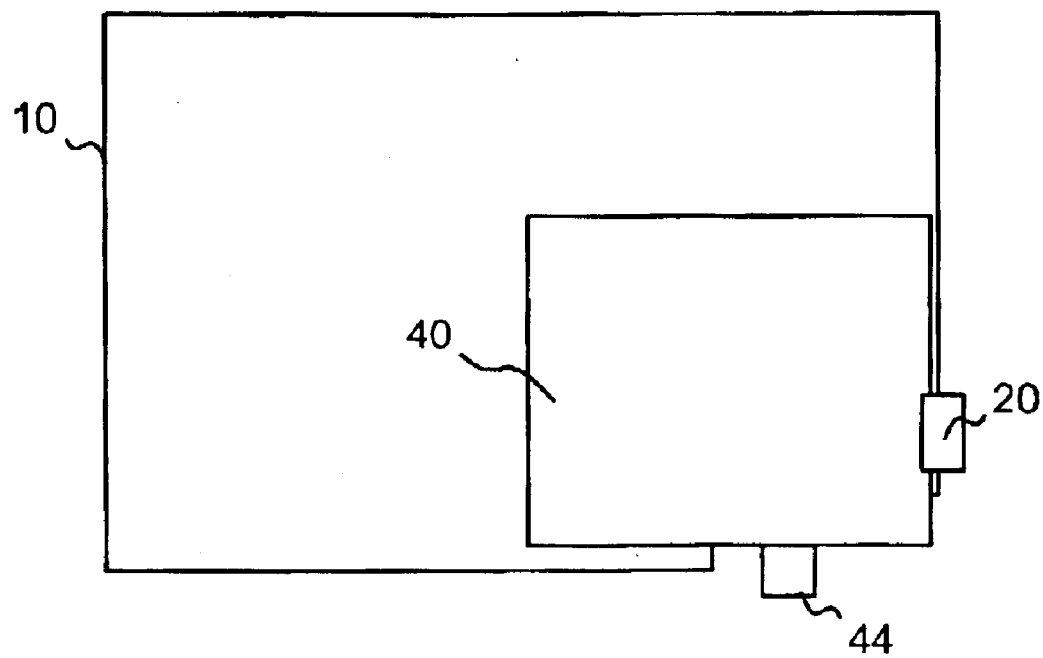
FIG. 3 is a plan view of the integrated inverted F antenna and shield can after folding.
Figure 4:
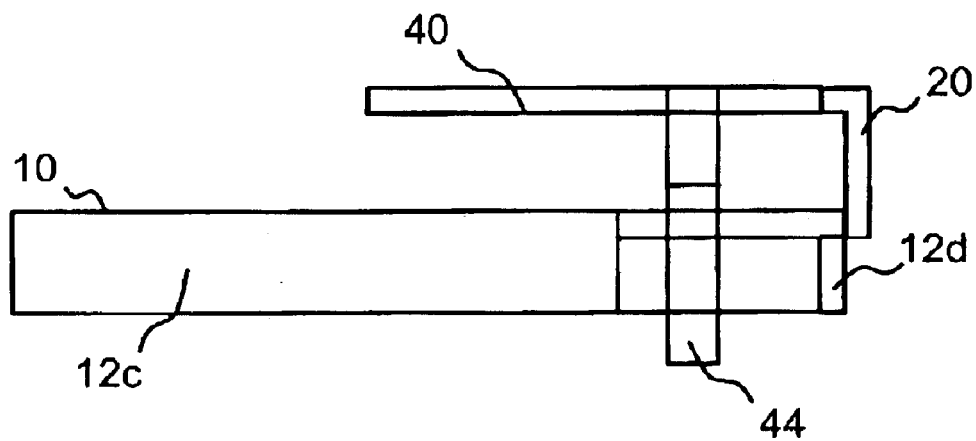
FIG. 4 is a signal feed line side view of the integrated inverted F antenna and shield can after folding.
Figure 5:
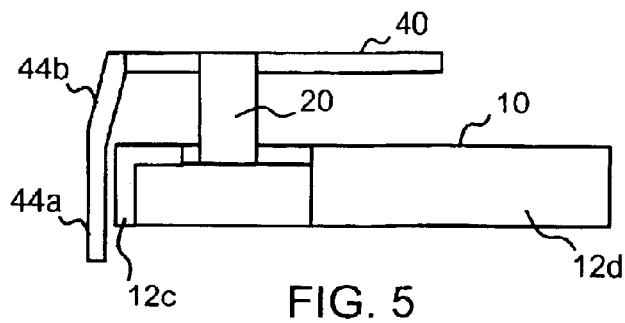
FIG. 5 is a ground tab side view of the integrated inverted F antenna and shield can after folding.

FIG. 1 is a perspective view of the integrated inverted F antenna and shield can mounted to a circuit board 5 according to a preferred embodiment of the present invention. FIG. 2 is a plan view of a single sheet of conductive material 7 prior to folding. FIG. 1 thus depicts sheet 7 of FIG. 2 in a folded configuration whereby both a shield can portion 10 and planar radiating element portion 40 can be easily seen. FIGS. 3–5 show plan, and different side views of the folded device shown in FIG. 1.

Referring again to FIG. 2, sheet 7, which is in a pre-folded state, preferably includes two major portions: a shield can portion 10 and a radiating element portion 40 that are connected to each other by a ground feed line 20 that bridges the shield can portion 10 and radiating element portion 40.

The shield can portion 10 preferably further comprises a plurality of walls 12a, b, c, d that substantially surround a periphery of shield can portion 10 and that are foldable along respective folds 14a, b, c, d. An optional notch 16 is defined by a cutout corner of shield can portion 10. The desired configuration of sheet 7 is preferably achieved by cutting and/or stamping processes, which are well known in the art.

Radiating element portion 40 preferably comprises a plurality of edges 42a, b, c, d and a signal feed line 44 that extends from one of the plurality of edges, in this case 42c. Signal feed line 44 is preferably foldable along at least one and preferably two fold lines 46a, 46b. Ground feed line 20 preferably extends from a second one of the plurality of edges, here 42b, to a location adjacent one of the walls (in this case 12d) and notch 16. Ground feed line 20 is preferably foldable along two fold lines 48a and 48b as shown.

When sheet 7 is folded along its several folds, radiating element portion 40 becomes suspended over shield can portion 10 and is substantially fixed with respect thereto by ground feed line 20. Radiating element portion 40 is also preferably fixed with respect to shield can portion 10 by soldering an end 46 of signal feed line 44 to circuit board 5. Finally, walls 12a, b, c, d are folded downward resulting in a "can" that is sufficiently large to cover an RF module (not shown) that is mounted on circuit board 5. At least two of walls 12a, b, c, d (or selected points thereof) are also preferably soldered to circuit board 5.

In one implementation, radiating element portion 40, i.e., an inverted F antenna using shield can portion 10 as a ground plane, is suspended in a location that is substantially within a periphery defined by the respective folds 14a, b, c, d of the plurality of walls 12a, b, c, d. In view of the positioning of radiating element 40 with respect to shield can portion 10 in the pre-folded state, when unitary sheet 7 is folded, radiating element 40 is suspended in a location that overlaps notch 16. Depending on how signal feed line 44 is bent, as described below, signal feed line 44 can pass through a space provided by notch 16 when sheet 7 is folded. It is noted that notch 16 is optional and may be provided to accommodate mechanical assembly requirements. Notch 16 or other forms of cutouts could be included along other peripheral portions of shield can portion 10. In other words, in the exemplary device shown in the Figures, notch 16 is meant to show that shield can portion 10 need not necessarily be entirely sealed and that the inverted F antenna with integrated shield can in accordance with the present invention may operate with different configurations.

As shown best by FIG. 5, signal feed line 44 can have a first leg 44a that is substantially perpendicular to parallel planes of shield can portion 10 and radiating element portion 40, and a second leg 44b that is disposed between the first leg 44a and radiating element portion 40 that may be arranged to be non-perpendicular with respect to radiating element 40. By having the ability to manipulate signal feed line 44 with these folds a more optimized field pattern may be achieved.

Figure 6:
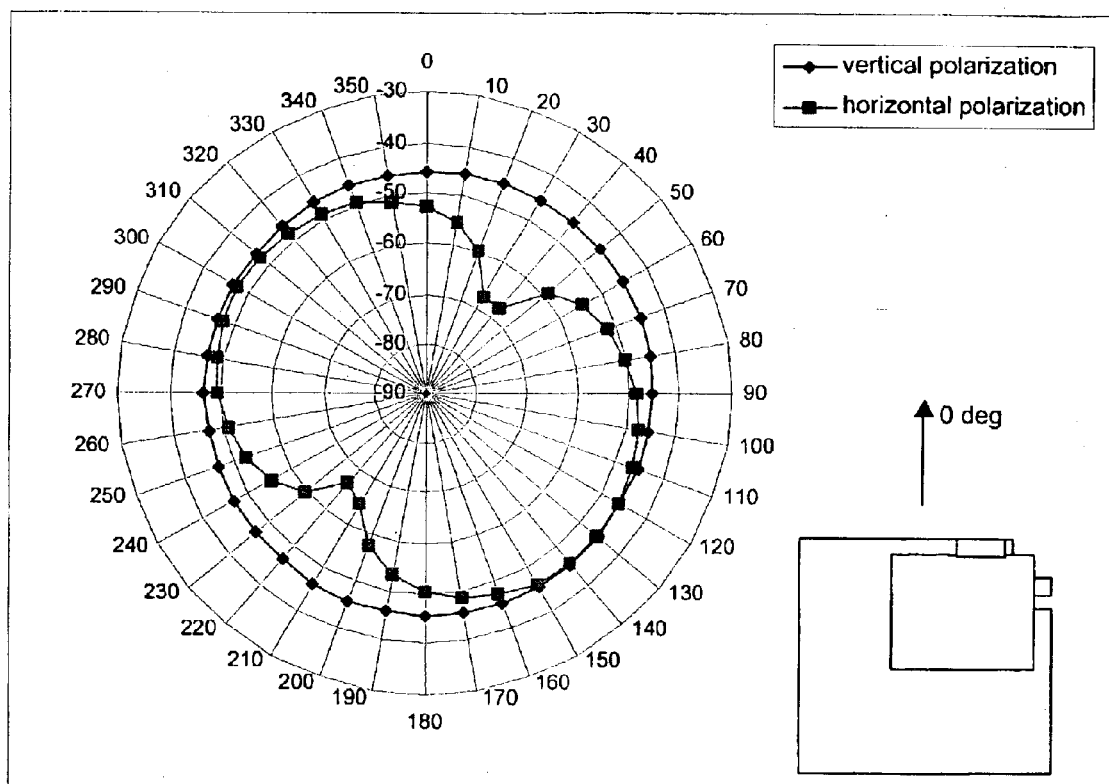
FIGS. 6–8 illustrate far field patterns of one implementation of the inverted F antenna and shield can in accordance with the present invention.
Figure 7:
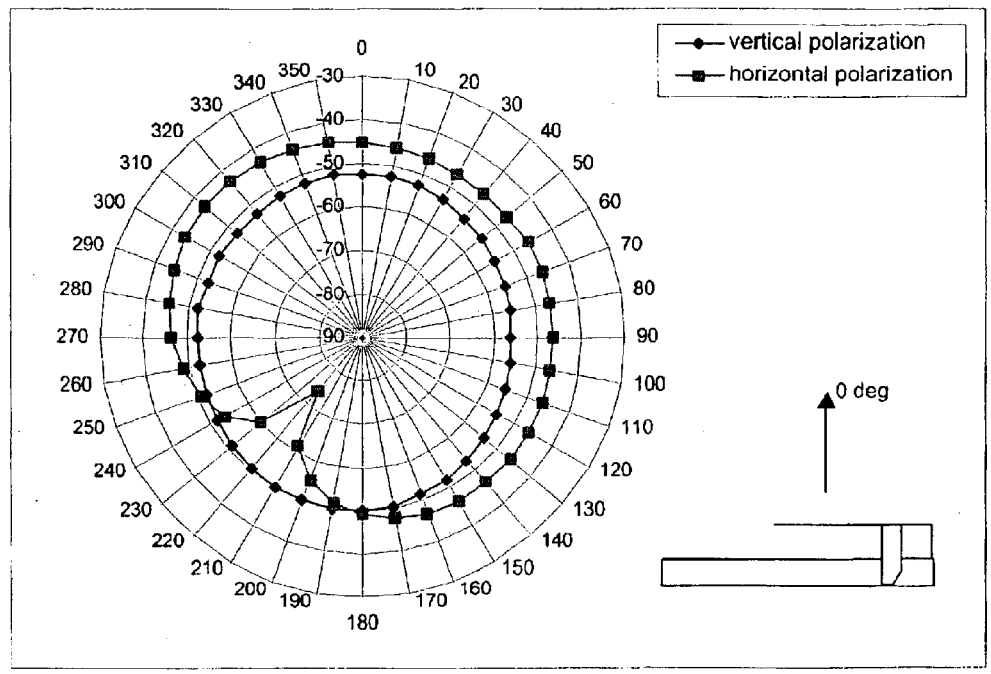
Figure 8:
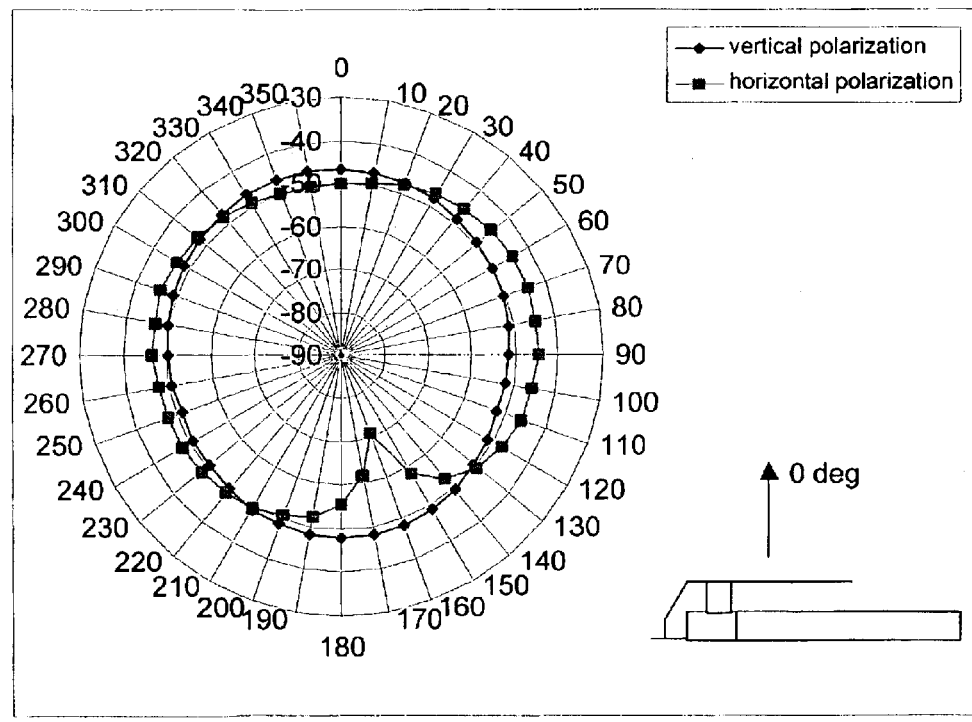
Figure 9:
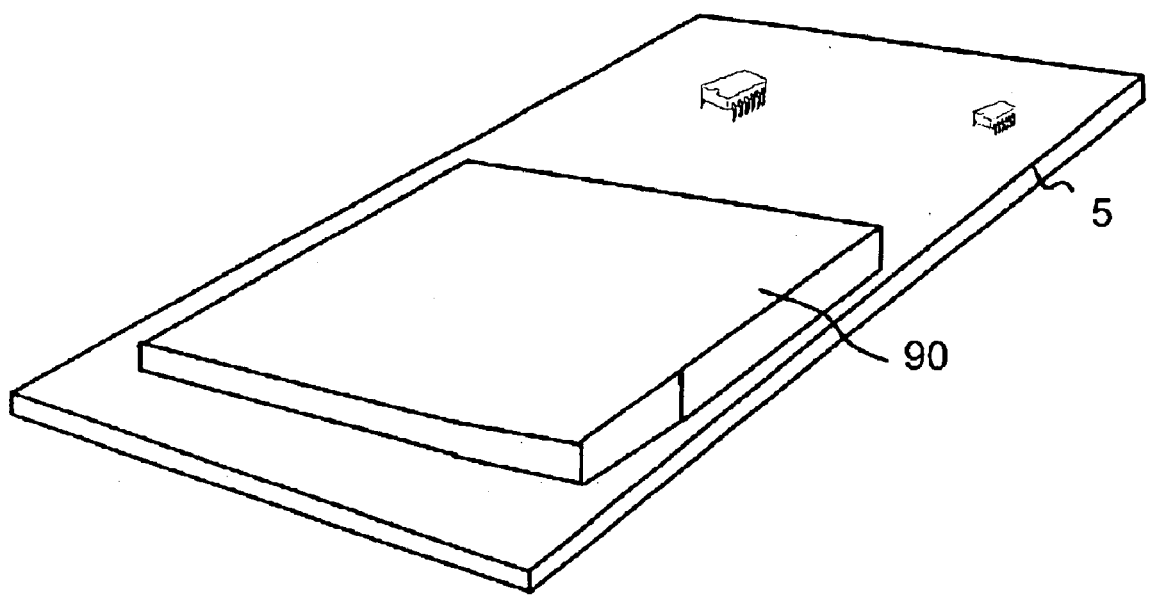
FIG. 9 shows a conventional shield can mounted on a circuit board.

FIGS. 6–8 illustrate far field patterns taken in the 2.4 GHz band and rotated around three different axes of one implementation (specified below) of the integrated inverted F antenna and shield can in accordance with the present invention. As is evident from these field patterns, a substantially omni-directional antenna is achieved. More specifically, the charts of FIGS. 6–8 were generated by measuring the far field at three (3) meters away from the DUT (device under test). Among other things, the delta of maximum field strength and minimum field strength in vertical polarization was recorded and was less than 10 dB in all directions (rotated around 360°). Such results are consistent with omni-directional properties.

The dimensions of the inverted F antenna and shield can for which far field pattern measurements were taken are as follows:

| | |
|---|---|
| Shield can height (wall height) | 4 mm |
| Shield can dimensions | 32.5 mm × 29 mm |
| Antenna dimensions | 17 mm × 19 mm |
| Ant. height from top of shield can | 4 mm |
| Ground feed line width | 5 mm |
| Signal feed line width | 2.5 mm |

The inverted F antenna and shield can in accordance with the present invention are easily constructed from a single unit or sheet of material. Consequently, the invention provides a simpler mechanical design that is easy to assemble and mount to a circuit board, thereby reducing cost.

Finally, the antenna in accordance with the present invention exhibits excellent electrical properties even in view of its compact space.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. For example, the specific configuration or shape of sheet 7 can be modified to accommodate smaller or larger shield cans and radiating elements. Also, sheet 7 itself need not be made from a material other than steel, e.g., copper, aluminum, or any other good electrical conductor. Ultimately, the scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. An inverted F antenna with integrated shield can, comprising:

an electrically conducting sheet having a pre-folded state and a folded state, the sheet having a shield can portion and a radiating element portion that are connected to each other by a ground feed line that bridges the shield can portion and radiating element portion, the shield can portion comprising a plurality of walls that are foldable along respective folds, the radiating element portion comprising a plurality of edges and a signal feed line extending from a first one of said plurality of edges, and the ground feed line extending from a second one of said plurality of edges, wherein when said sheet is in a pre-folded state each of the shield can portion, walls, radiating element portion, ground feed line, and signal feed line are arranged in a single plane, and when said sheet is in a folded state the radiating element portion is suspended over the shield can portion and is substantially fixed with respect to the shield can portion by the ground feed line and the signal feed line.

2. The inverted F antenna with integrated shield can according to claim 1, wherein at least selected points of the plurality of walls and an end (46) of the signal feed line are soldered to a circuit board.

3. The inverted F antenna with integrated shield can according to claim 1, wherein the radiating element is suspended in a location that is substantially within a periphery defined by the respective folds of the plurality of walls.

4. The inverted F antenna with integrated shield can according to claim 1, further comprising a notch (16) along a periphery defined by the respective folds of the plurality of walls.

5. The inverted F antenna with integrated shield can according to claim 4, wherein the radiating element is suspended in a location that overlaps the notch.

6. The inverted F antenna with integrated shield can according to claim 4, wherein, in the folded state, the signal feed line is arranged to pass through a space provided by said notch.

7. The inverted F antenna with integrated shield can according to claim 1, wherein the shield can covers an RF module.

8. The inverted F antenna with integrated shield can according to claim 1, wherein, in the folded state, the signal feed line comprises a portion that is substantially perpendicular to the radiating element portion.

9. An inverted F antenna, comprising:

a planar radiating element; and a ground plane, the ground plane being disposed substantially parallel to the radiating element, the ground plane being a part of a shield can having down turned wall portions that are substantially perpendicular to the radiating element and the ground plane, wherein the radiating element and ground plane are connected to each other by a ground tab that is folded in at least two locations and is disposed at respective edges of the radiating element and ground plane, and wherein the radiating element, shield can and ground tab comprise a unitary material.

10. The inverted F antenna of claim 9, further comprising a signal feed line that extends from the radiating element.

11. The inverted F antenna of claim 9, wherein the shield can comprises a notch.

12. The inverted F antenna of claim 11, wherein the radiating element overlaps, at least partially, the notch.

13. The inverted F antenna of claim 9, wherein the shield can is soldered to a circuit board and covers an RF module.

14. The inverted F antenna of claim 9, wherein the radiating element is located substantially within a periphery of the shield can that is defined by the down turned wall portions.

15. The inverted F antenna of claim 9, wherein a delta of maximum field strength and minimum field strength in the far field in vertical polarization is less than 10 dB in all directions.

16. An inverted F antenna, comprising:

a planar radiating element having a plurality of edges, a first edge having an integral signal feed line extending therefrom;

a shield can having a plurality of walls; and an integral ground feed line extending between a second edge of the planar radiating element and the shield can, wherein the planar radiating element is supported over the shield can by at least the ground feed line and is located substantially within a periphery defined by the plurality of walls, and wherein the shield can functions as a ground plane for the planar radiating element.

17. The inverted F antenna of claim 16, wherein the planar radiating element and shield can comprise a single piece of material.

18. The inverted F antenna of claim 16, further comprising a signal feed line that extends from the planar radiating element.

19. The inverted F antenna of claim 16, wherein the shield can comprises a notch.

20. The inverted F antenna of claim 19, wherein the planar radiating element overlaps, at least partially, the notch.

21. The inverted F antenna of claim 16, wherein the shield can is soldered to a circuit board and covers an RF module.

22. The inverted F antenna of claim 16, wherein the planar radiating element is located substantially within a periphery of the shield can that is defined by the walls.

23. The inverted F antenna of claim 16, wherein, in the 2.4 GHz band, a delta of maximum field strength and minimum field strength in the far field in vertical polarization is less than 10 dB in all directions.

* * * * *